United States Patent [19]

Dekker et al.

[11] 4,157,591
[45] Jun. 5, 1979

[54] MAGNETIC DOMAIN DEVICE

[75] Inventors: Evert H. L. J. Dekker; Willem F. Druyvesteyn; Franciscus A. Kuijpers; Antonius G. H. Verhulst, all of Eindhoven, Netherlands

[73] Assignee: U.S. Philips Corporation, New York, N.Y.

[21] Appl. No.: 754,962

[22] Filed: Dec. 28, 1976

[30] Foreign Application Priority Data

Aug. 10, 1976 [NL] Netherlands .......................... 7608861

[51] Int. Cl.² ........................................... G11C 19/08
[52] U.S. Cl. ...................... 365/19; 365/12; 365/15; 365/36; 365/43
[58] Field of Search ................... 340/174 TF; 365/12, 365/19, 20

[56] References Cited

U.S. PATENT DOCUMENTS 3,997,877  12/1976  Naden ........................... 340/174 TF

OTHER PUBLICATIONS

IEEE Transactions on Magnetics, vol. Mag-9, No. 3, Sep. 1973, pp. 493–495.

Primary Examiner—James W. Moffitt
Attorney, Agent, or Firm—Thomas A. Briody; Edward J. Connors, Jr.; James J. Cannon, Jr.

[57] ABSTRACT

A magnetic bubble domain memory system having a first bubble domain path composed of Permalloy pattern elements, and a second bubble domain path composed of a current conductor is disclosed. Separate drives are associated with each of the paths, so the advantages of both types of domain propagation can be combined on a single memory chip. The first and second paths are interconnected, so transfer of domains between paths is possible.

14 Claims, 8 Drawing Figures

MAGNETIC DOMAIN DEVICE

BACKGROUND OF THE INVENTION

1. Field of the Invention

This invention pertains to a memory device, comprising a plate of magnetic material which is suitable for the storage of digital information in the form of magnetic domains and on which a domain guide structure is provided. The guide structure comprises discrete elements on which preferred positions for the domains can be formed at predetermined times under the control of drive means. The drive means drives the domains along the domain guide structure by the periodic formation of the preferred positions. The device also includes detection means for the selective and separate detection of domains in accordance with their information content.

2. Description of the Prior Art

Memory devices of this kind have been described in copending U.S. Pat. No. 4,091,459, herein incorporated by reference. In the known device the domains are driven by a rotary magnetic field along a domain guide structure which is mainly composed of T-elements and I-elements. It has been found that it is very difficult to realize a high drive frequency by means of such a rotary magnetic field; this is due to the inductance of the magnetic coils used.

The present invention has for its object to provide a domain memory which has a higher operating frequency at least as "seen" by the user. The invention further has for its object to enable a higher operating frequency for the input sections or output sections of the domain guide structure. The input and output of the information is thus quickly effected. A further characteristic aspect of the known device is the fact that all domains are driven under the control of the rotary magnetic field, so that complex organizations are required for isolating input/output paths from loop-shaped path sections which serve only for the storage of information. In this respect the invention also has for its object to provide a device with independent driving of the magnetic domains in different path sections. The invention aims to maintain the attractive properties of the known device as much as possible, notably the low dissipation per bit.

SUMMARY OF THE INVENTION

The objects in accordance with the invention are realized by providing two different types of drive means. The first drive means comprises a magnetic field generator for generating a magnetic drive field which periodically varies in time for driving the domains along a first path section which comprises discrete, magnetically operating elements which are situated mainly along the plane of the plate. The second drive means comprises a current generator for generating an electrical current which periodically varies in the time in an approximately spatially periodic current conductor for driving domains along a second path section which is situated along the current conductor. The first and second path sections are connected by at least one interconnection for transferring magnetic domain information. There is also provided a control device having respective control outputs for independent control of the magnetic field generator and the current generator. The attractive aspects of the invention are embodied in the advantageous combination of two different drive mechanisms, so that on the one hand each of these two mechanisms is used for the particular functions for which it is most suitable, while on the other hand new devices which could not be realized thus far can be effectively constructed. The dissipation in the current conductor is comparatively high for each operating period, but only a limited part of the domain guide structure includes a current conductor and, moreover, this current conductor is actuated only at time intervals. Furthermore, the current conductor is usually constructed only as a single path, so that the heat developed can be dissipated in a direction transverse to this path; the temperature rise in the layer of magnetic material is thus limited.

The magnetic drive field is preferably a rotary magnetic field which rotates in the plane of the plate. The frequency of the periodically varying electrical current preferably exceeds the rotary frequency of the rotary magnetic field. In accordance be constructed as either fast or slow elements.

Preferably, an output of the first path section is connected to an input of the second path section for transferring magnetic domains. The detection means are connected to the second path section. The bit frequency of the second path section may be comparatively high, so that a rapid output of information can be realized in a short period of time. During a rest period, new information can be prepared for output. The domains can be applied directly to the output path or can be replicated thereon. In the latter case non-destructive reading is obtained. On the other hand, it may also be advantageous to connect the detection means also or exclusively to the first path section. As result of the use of two different drive means, an additional degree of safety is always introduced against spurious detection.

Preferably, the first path section comprises a replication element having an input from and an output to the first path section for unmodified conduction of magnetic domains. The replication element comprises a further output which is connected to an input of the second path section for the transfer of replicated domains. The detection means being connected to the second path section.

Preferably, the connection comprises a replication element for domain information which has an input and an output for magnetic domains for the first as well as the second path section. The information of the one path section is replicable on the other path section so that in the case of simultaneous presence of the domains on both path sections, the path of a domain on the other path section is modified under the influence of the repulsion between domains with respect to the path if no domain were present on the one path section. The information transfer can thus be combined with the formation of an additional logic function.

The first path section is preferably connected, by way of a number of parallel connected outputs, to a corresponding number of inputs of the second path section. The transfer of information between first and the second path section is thus accelerated.

On the other hand, the second path section preferably comprises domain generating means for generating magnetic domains thereon, an output of the second path section being connected to an input of the first path section. The input of information can thus be effected independent of the operations in the first path section, so that therein regrouping of the information can be effected.

The first path section preferably comprises a first number of loops, each of which includes a domain replicator having a first output which is connected to an input of the second path section and a second output which is coupled end-around in order to close the said loop. By means of such an organization, a high storage capacity can be realized, while the access time to the information remains limited, notably if the operating frequency of the current generator can be high. The storage capacity is further increased by providing a second number of auxiliary loops for each storage loop. For each auxiliary loop there is provided an output which is connected to an input of the associated main loop.

BRIEF DESCRIPTION OF THE DRAWINGS

The invention will be described in detail hereinafter with reference to the drawing.

Figure 1:
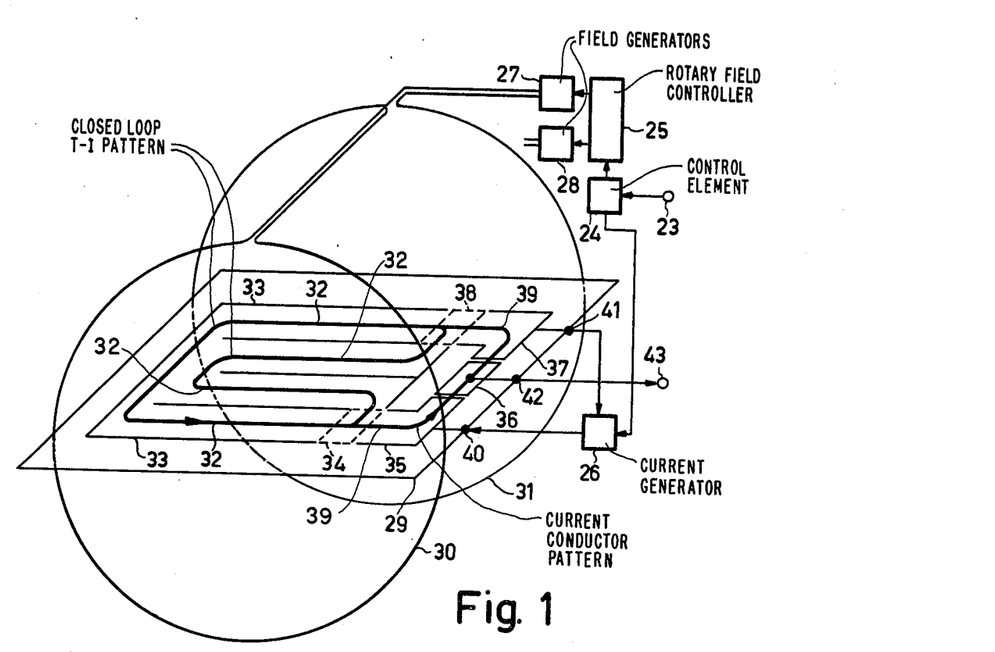
FIG. 1 shows a partial spatial diagram of a magnetic domain device in accordance with the invention.

FIG. 1 shows a partial spatial diagram of a magnetic domain device in accordance with the invention, comprising a control terminal 23; a control element 24; a rotary field controller 25; a current generator 26; two field generators 27, 28; a plate of magnetic material 29; two rotary field coils 30, 31; a first path 32 for magnetic domains; a first path region 33; connection path regions 34 and 38, a second path 39 which branches from path 32; further path regions 35, 37, a detection path region 36; current supply pads or terminals 40, 41 located on the surface of the plate 29; and detection terminals 42, 43.

The device shown in FIG. 1 comprises a plate 29 of magnetic material, for example, substituted yttrium iron garnet, in which magnetic domains can be sustained by a field of a main magnetic field generator which field is directed transversely of the plate; the generator is not shown for the sake of simplicity. It may be a permanent magnet. In this simple arrangement, the memory device acts as a read-only memory, so that no information source need be present. Information could be selectively written in by optical means. The internal construction of the plate of magnetic material can be realized according to the known technique.

In the regions 33, 34, 38 magnetic domains can be driven along the path sections therein contained (diagrammatically shown) by a rotary magnetic field which is directed in the plane of the plate and which rotates, for example, counter-clockwise. Other drive mechanisms utilizing a magnetic field which periodically varies in intensity or direction can be similarly applied.

The rotary magnetic field can be generated in that the current generators 27, 28 actuate the coil pair 30/31 and a second coil pair which is not shown. The axis of the first coil pair 30/31, and hence the field direction, extends in the plane of the plate of magnetic material and perpendicularly to the plane of the drawing. The field direction of the second coil pair extends in the plane of the plate and parallel to the plane of the drawing. Sinusoidal currents having a mutual phase difference of 90°, produce a magnetic field therein which is constant as regards strength and which rotates at a uniform speed (at least in the central region of the coils). The closed loop path 32 shown as a heavy line in the regions 33, 34 and 38 can have a structure composed of T-I elements or of chevrons of vapour-deposited magnetically active material such as permalloy. Use can also be made of grooves or zones which are provided in the plate and in which the magnetic properties are modified by ion implantation. Use can alternatively be made of NiCo as an additional material. Other known magnetically active elements are, for example, disc-shaped. The regions 34, 35, 36, 37, 38 comprise a meander-shaped current conductor path 39 which branches from the path 32 in regions 34 and 38. The domains can be driven along path 39 as will be described hereinafter. The region 36 comprises a detection member of conventional construction which is not shown in this figure. When a domain passes this element in the direction of the arrow, a signal appears on the terminals 42, 43; the value of this signal corresponds to the information content of the passing domain. A domain which arrives in the path region 34 along the path 32 can then be driven in two different ways. First of all, the "meander" current can remain unused, while the rotary field continues its operation. In that case the domain is driven further along the path 32 in region 33 in the direction of the arrow (which is to the immediate left of the numeral 32) and can complete further circulations turning left at 34 and continuing along a closed loop shown by the heavy lines. On the other hand, the rotary field can be switched off (or can possibly remain in a given position) when a domain has arrived in the path region 34; the further driving is then provided by the current in the "meander" conductors 39. In given cases, one of the two drive mechanisms will always prevail when both drive mechanisms act on a single domain, as will be described hereinafter. When the path region 34 is empty, the rotary magnetic field can apply another domain in the region 34. The filling of the path region 35 is effected at a speed which is determined substantially completely by the frequency of the rotary magnetic field, because the drive frequency of the "meander" conductors 39 may be, for example, ten times higher. On the other hand, this does not represent a restriction and the frequency of the rotary magnetic field may also be just equal to or higher than the frequency of the current in the "meander" conductors 39. The location and the function of the path section regions with rotary field drive and "meander" current drive may also be interchanged. When the path region 35 has been sufficiently replenished, this buffered information can be applied at the desired speed, by continued excitation of the "meander" conductors 39 by the device 26, to the path region 36 where the detected information becomes available on the output 43. The void positions are meanwhile transported from the region 34, via the path 32, to the region 38 and can be filled again by alternate actuation of "meander" conductors 39 and rotary field coils. The organization of the information may be so that the path 32 contains a number of words which each consist of a number of successive domains (and possibly void positions). The regions 35 and 37 must then offer room for a complete word. The extent of the regions 34, 36, 38 is generally limited. The device 24 keeps track of the addressed words and their positions on the path 32 as well as on the path 39; see the description with reference to FIG. 7.

Figure 2:
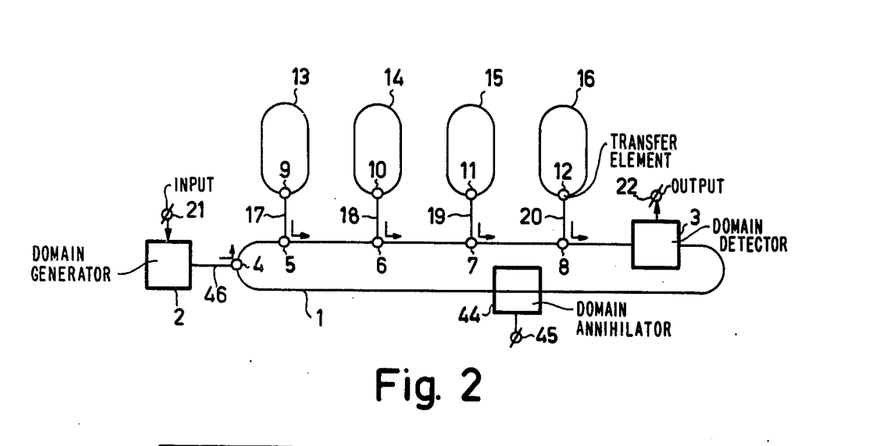
FIG. 2 shows a first organization of domains on a plate of magnetic material.

FIG. 2 shows an organization of domains on a plate of magnetic material; it shows a domain generator 2 for magnetic domains, including an information input terminal 21, path sections 1, 17, 18, 19, 20, 13, 14, 15, 16, 46, transfer elements 4, 5, 6, 7, 8, 9, 10, 11, 12, a domain detection element 3 with an information output terminal 22. Also shown is a domain annihilator 44 with a control terminal 45. The memory device is adapted for the storage of information which can be modified at random and can be read by non-destructive detection means (just as in FIG. 1). The storage of information is organized in accordance with the known major loop/-minor loop principle. The information to be stored arrives in binary coded form on the information input terminal 21 from an information source not shown (for example, a processor or an information channel). In the domain generator 2 the information is converted into domains and void domain positions respectively which are subsequently driven, in synchronism with the operation of a drive device (not shown) for one or more meander conductors, along the path section 46 in order to arrive on the main loop 1 by the transfer element 4 (which acts as a converging switch). The movement on loop 1 is clockwise. When a domain passes the detection element 3, a signal corresponding to the information content of the domain or the void domain position appears on the output terminal 22. When a domain passes the annihilator 44, it can be converted, under the control of a signal on the control terminal 45, into a void domain position which may count as a logic "0." The driving along the main loop by means of a meander conductor arranged along the path can be effected at a very high or at least arbitrary speed. When the meander conductor is not actuated or is actuated with a constant current, the domains present thereon remain stationary. The element 4 operates as a converging switch towards the main loop. When a domain series is present at the area of the transfer elements 5, 6, 7, 8, the driving by the "meander" conductor can be temporarily stopped and taken over by a rotary magnetic field in the counter clockwise direction, so that in this case four domains are driven along the path sections 17, 18, 19, 20 in the direction of the transfer elements 9, 10, 11, 12; they subsequently arrive on the auxiliary loops 13, 14, 15, 16 where they circulate. A period of driving by the rotary magnetic field may be followed by a period of driving by the meander actuation, in order that four subsequent domains can be taken over on the path sections 17, 18, 19, 20. A series/parallel conversion is thus realized, so that the take-up speed of the auxiliary loops is increased by a factor 4. Reversal of the sense of rotation of the rotary magnetic field causes reversal of the movement direction of the domains, so that they travel from the auxiliary loops 13–16, via the transfer elements 9–12 and the path sections 17–20, to the transfer elements 5–8. From these elements they can be discharged by actuation of the meander conductors in the described manner. The storage can be effected in a manner so that there are four auxiliary loops as in this case. The generator 2 then generates a continuous flow of domains, but a series of $n=4$ periods of the current in the meander conductors is terminated by one period of the rotary magnetic field for discharging the domains. The successive transfer elements, for example, 5, 6, 7, 8, can then be shifted, for example, over $n-1=3$ or $n+1=5$ periods of the domain guide structure, so that all domains can be stored in successive auxiliary loops and, on the other hand, a continuous series of domains and void positions can be reconstructed on the path 1 in a similar manner.

Figure 3:
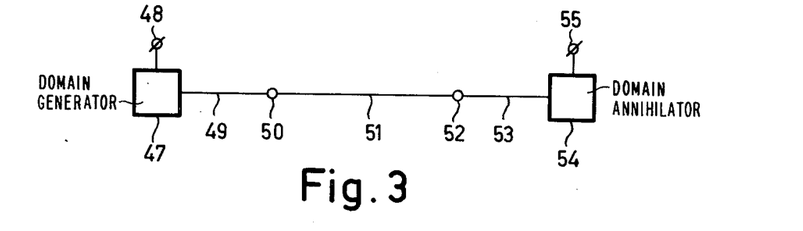
FIG. 3 shows a second organization on a plate of magnetic material.

FIG. 3 shows a second organization on a plate of magnetic material, comprising an information input terminal 48, a domain generator 47, a path section 49 on which the domains can be driven by a periodic current in a meander conductor, a first connection point 50 where the domains can be transferred to a path section 51 on which the domains can be driven by a rotary magnetic field via preferred positions on magnetically operating elements, a second connection point 52 where the domains can be transferred to a path section 53 which is operational as the path section 39, the domain detector and domain annihilator 54, and an information output terminal. An information buffer having an independent input/output is thus realized. This splitting of the constant driven path into two independent parts has two advantages. In the first place, the independence of input and output mechanisms is realized as a new and useful feature. In the second place, for each of the two functions only a fraction of the current driver path needs to be energized, which leads to a decreased dissipation of energy. The latter argument would also apply if a long current driven path with only a single function would be divided into separate paths which could be activated separately.

Figure 4:
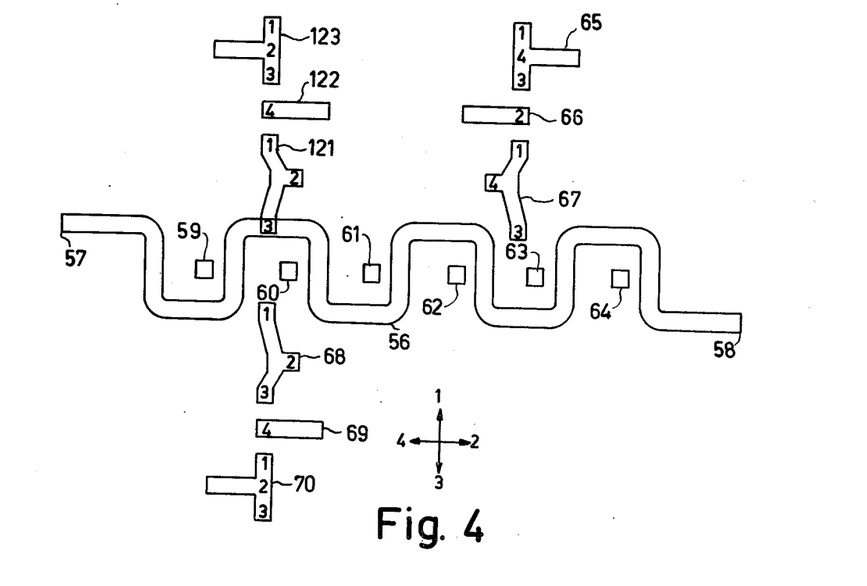
FIG. 4 shows an embodiment of the two path sections and their connections.

FIG. 4 shows an embodiment of two path sections and their interconnections on a plate of magnetic material. The device comprises a meander conductor 56 of a suitably conductive material, having connections 57 and 58, six more or less square (or possibly round or otherwise shaped) small elements of permalloy 59–64, three T-shaped elements 65, 70, 123, three I-shaped elements 66, 69, 122, and three Y-shaped elements 67, 68, 121 which are all made of permalloy.

Preferred positions are formed on the larger permalloy elements (T, I, Y) by a rotating magnetic field in the plane of the plate. When the field is directed according to the arrow 1 (system of co-ordinates), this preferred position is, for example, the position 1 on the element 65: notation 651. After one quarter period of counter-clockwise rotation of the rotary magnetic field, this will be the position 4 on the element 65: notation 654. Further counter-clockwise rotation of the magnetic field results in further transport until ultimately the position 673 is reached. The opposite direction of rotation also results in opposite movement direction. When the position 673 has been reached, the element 63 also assists, also when the rotary magnetic field is switched off, to enable a permanent preferred domain position to be formed at this area. In many cases there is a preferred position if the edge of a mainly disc-shaped domain coincides as well as possible with elements of permalloy. In this case the center of such a preferred position will be situated halfway between the elements 62 and 63. If the "meander" conductor 56 is then actuated so that the main magnetic field is intensified transversely of the plate in the half period of the element 63, the field is attenuated at the elements 62, 64 and a domain present between the elements 63 and 62 is shifted to the half period of the element 62. This propagation direction results from the asymmetrical arrangement of the element 62 in the surrounding half period of the "meander" conductor. The take-over can possibly be facilitated in that at the instant of the first half period of the actuation of the "meander" conductor the rotary magnetic field is present in the direction of the arrow "2." Subsequent alternately directed half periods of the current in the "meander" conductor 56 then transport a domain further in the direction of the arrow 4. A sequence of half periods having like directions has no effect. In the case of an interruption of the series of half periods, the driving of the domains is also interrupted. The power supply may also consist of a superposition of alternately directed current pulses plus a direct current. When the element 60 is reached and a rotary magnetic field is applied in the direction of the arrow 1, this domain moves to the preferred position 681 then formed. Clockwise rotation of the rotary magnetic field then causes further displacement in the direction of the position 682 and on to the element 70. Thus, an intersection is realized of a domain guide structure which is mainly formed by the "meander" conductor 56 and a domain guide structure which is formed by magnetically active elements 65–70 of, for example, permalloy. When a domain reaches the element 60 via the "meander" conductor 56, the domain can be output in the direction of the element 123 by way of a rotary magnetic field in the direction of the arrow 3, followed by counter-clockwise rotation. By continuous clockwise rotation of the rotary magnetic field, a domain can also be transported in the direction from the element 123 to the element 70, across the path of the "meander" conductor. In this case the element 121 is situated above or below the plane of the "meander" conductor 56.

Other embodiments are also feasible. For example, phases other than the phases 1, 3 of the rotary magnetic field can be used for discharging a domain by including a bend in the "meander" conductor 56. A plurality of input and output paths can be connected to the "meander" conductor. A two-dimensional network can be composed by using two or more "meander" conductors and a plurality of transverse paths.

Figure 5:
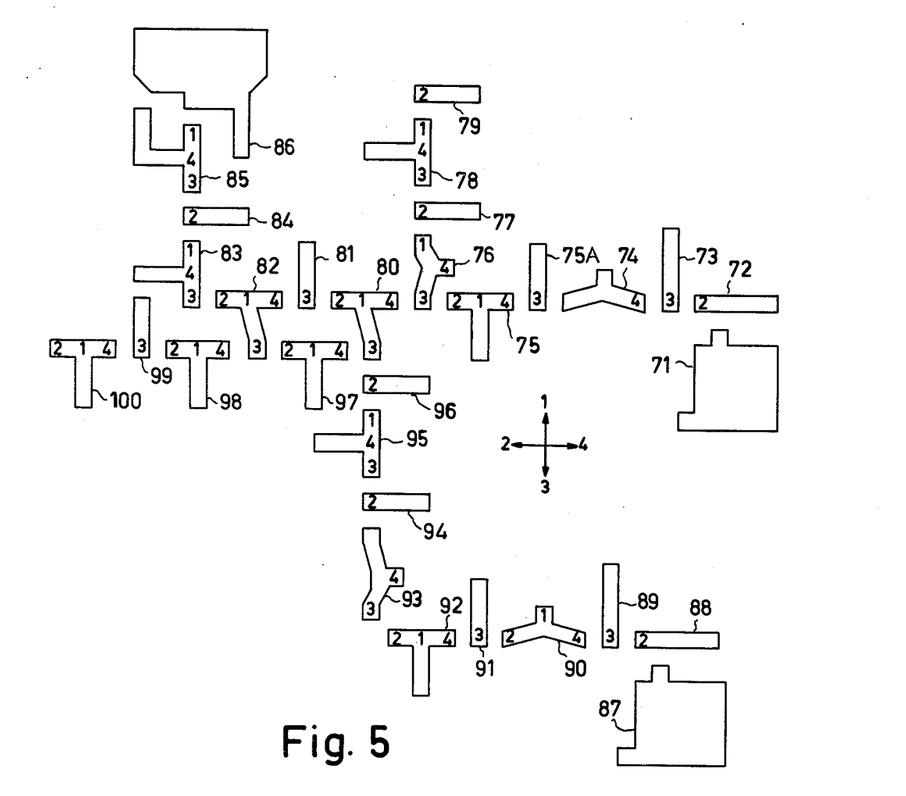
FIG. 5 shows a first replicating element for magnetic domain information.

FIG. 5 illustrates the use of a replicating element in a path section along which the domains can be driven by a rotary magnetic field. As is shown, the device comprises thirty-one permalloy elements 71–100 and 75A which are vapour-deposited on the plate of magnetic material. The notation of the preferred positions is like in FIG. 4. The replicating element 87 operates as a source of magnetic domains in that a source domain which is continuously present on this element is split during each period of the rotary magnetic field in the counterclockwise direction, the said separated domain being output along the series of positions 882, 893, 904 . . . . Similarly, a source domain present on element 71 can be split, the separated domains being output along the series of positions 722 . . . 752. The separated domains of the replicating source element 87 turn through an angle of 90° to the right at the element 93 and through an angle of 90°0 to the left at the position 803, after which output is effected via the positions 974, 971, 972, 823 . . . 1002. This flow of domains is thus maintained without modification. When a domain originating from the replicating source element 71 is present in the position 763 and a domain (from source element 87) is also present in the position 803, the next preferred position for the former domain will be 764 under the influence of the repulsion which always exists between neighbouring domains. Further output is then effected via the series of positions 761, 772 . . . 792. If a domain is present in the position 763 and the position 803 does not accommodate a domain (see hereinafter), no additional repulsion occurs and the next preferred position after 763 will be 804, after which this domain is applied, via the positions 801, 802 . . . and a 90° angle at the position 833, to the position 851 and the domain annihilator 86. Via the elements 77–79 a domain flow replicated from the element 87 is output. The end of this path can be connected to a path including a "meander" conductor in accordance with FIG. 4. The domain replication element 87 represents a source of a flow of domains containing information. The information can be introduced in different manners. A first method consists in the use of an additional current-carrying loop at the element 87, for controlling the formation or not of a domain. A selectively activatable source element for magnetic domains of this kind is known from the article by F. A. Kuijpers, Single Mask Bubble Memories, I.E.E.E. Transactions on Magnetics, Volume Magn. 11, No. 5, September 1976, page 1136. A second method of selectively adding information to a flow of domains is the inclusion of a diverging switch in the output path of the element 87, so that a domain can use the one or the other output thereof under the control of a suitable rotary field sequence (see U.S. Pat. No. 4,091,459). These methods are stated only by way of example. The replicated information can subsequently be applied to a path section having a "meander" conductor, while the information is maintained. The domain replication source 87 is also to be considered symbolically as a memory system, for example, as shown in FIG. 8.

Figure 6:
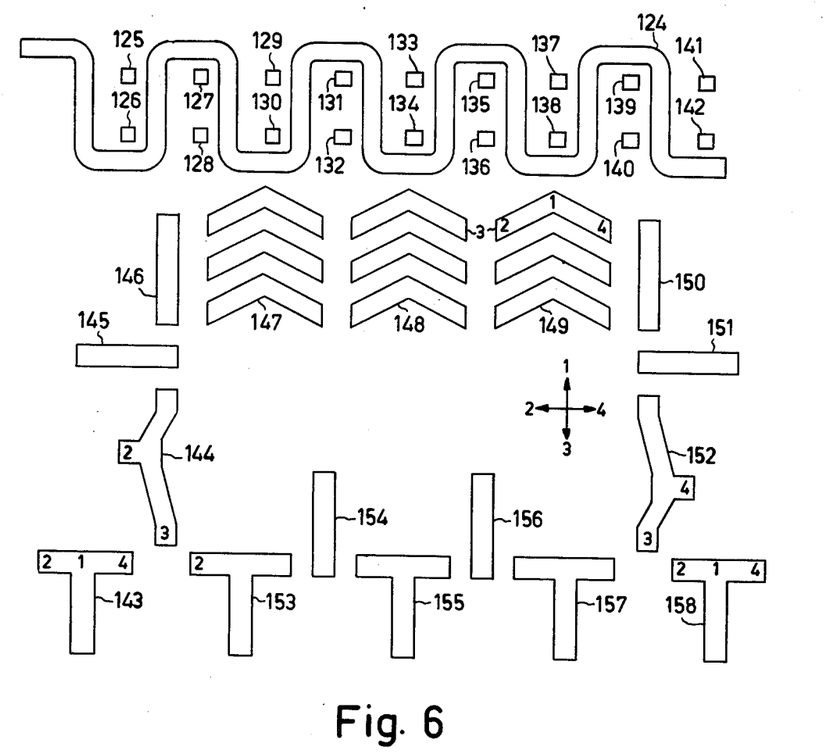
FIG. 6 shows a second replicating element for magnetic domain information.

FIG. 6 shows a second replicating element for magnetic domain information, comprising a "meander" conductor 124 having permalloy elements 125–142 as the second path section and a domain guide structure comprising permalloy elements 143–158. Under the control of clockwise rotation of the rotary magnetic field, a domain travels to the position 1584 via the positions 1432, 1431, 1434, 1443, 1532, . . . etc. Under the control of counter-clockwise rotation of the rotary magnetic field, a domain travels, via the positions 1584, 1581, 1582, 1523, 1524 . . . and the chevrons 149, 148, 147, to the position 1442, 1443, 1434 . . . . Thus, the domain passes through the chevron path in only one direction, but this is not a restriction. The "meander" conductor 124 can drive domains in the direction of the arrow 2 along either the even or the odd elements of the series 125–142. A domain on the element 137 represents, for example, a binary "0" and travels to the element 135; a domain on the element 138 then represents a binary "1" and travels to the element 136. Information storage of this kind, utilizing two parallel domain paths operated by a single "meander" conductor, is known per se, for example, from U.S. Pat. No. 3,699,548, for example in FIG. 1. Pairs of elements such as 137/138 cannot simultaneously contain two domains. When the pair of elements 137/138 contains a domain and at the same time a domain is present in the position 1491 (this domain is then longitudinally stretched in the direction of the arrow "1"), repulsion occurs between the two domains. When the first domain was present on the element 137, nothing further will happen. If the first domain was present on the element 138, it will be driven to the element 137. If the driving by the "meander" conductor 124 is in synchronism with the counter-clockwise rotation of the rotary magnetic field, the information on the path of the "meander" conductor can be taken up in a continuous flow of domains driven thereon. If the latter flow is not continuous, and hence also contains binary information, a logic function can be formed between the two kinds of domain flow information. Other possibilities consist in that both drive frequencies differ (so that, for example, a logic function is formed between one domain on the "meander" path and a plurality of domains on the other path). On the exit side of the "meander" path (on the side of the elements 125–126) the two flows of domains can be split or not and can be further used.

Figure 7:
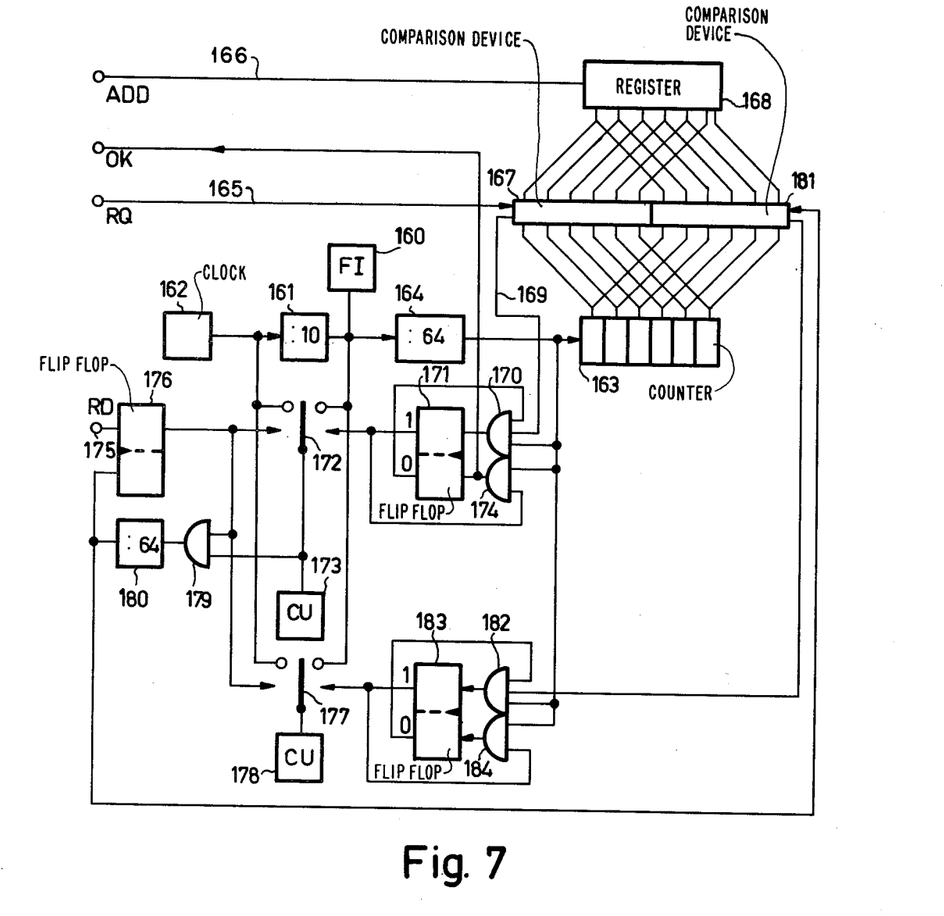
FIG. 7 shows a control element.

FIG. 7 shows a control element to be used in a device as shown in FIG. 1. The looped path 32 comprises 64×64 bit positions. The information is organized in words of 64 bits, the first four of which are not used for information storage. The rotary magnetic field is continuously actuated by the generator 160 which receives, via the divide-by-ten device 161, the signals of the clock 162 and which synchronizes the periods of the rotary magnetic field with the pulses received. The counter 163 is connected to the output of the divide-by-64 device 164 and thus acts as a word counter. When given information is requested by a user (for example, a computer), the latter dispatches a one-bit request signal via the line 165, the signal activating the comparison device 167, and a six-bit address signal to the register 168 via the line 166. When the correct address is reached, the comparison device 167 detects the beginning of the correspondence and dispatches a take-over signal, via the line 169, to the AND-gate 170. The flipflop 171 was in the zero position, so that AND-gate 170 receives three "1" signals and sets the flipflop 171 to the position "1." This flipflop actuates the switch 172, so that the generator for the "meander" control 173 receives the output pulses of the divide-by-ten device 161 and controls one period of the "meander" per pulse which comprises the path section 35: the relevant word is then transferred to this path section. When the divide-by-64 device 164 supplies a further pulse, the AND-gate 174 receives two "1" signals and the flipflop 171 is set to the zero position again. The output signal of the gate 174 acts as a destination signal for the device requesting information. When the information can be received, the line 175 receives a read signal which sets the flipflop 176 to the "1" position. This flipflop operates the switches 172 and 177 so that the generators for "meander" control 173 and 178 directly receive the pulses from the clock 162 and the entire word is passed along the detector region 36 of FIG. 1 at a high speed. After 64 periods, the entire word has been read and the divide-by-64 device 180 supplies a signal via the AND-gate 179 for controlling the rewriting. This signal activates the comparison device 181 which operates like the comparison device 167, be it that the most significant bit is inverted. After the passage of 32 word positions, the beginning of the now void word location has arrived at the region 38. The correspondence signal of this comparison device sets, via the AND-gate 182 which now received three logic "1" signals, the flipflop 183 to the "1" position. Via the switch 177, the rotary field generator 178 is activated by the clock frequency which has been divided by ten, so that the word is written back again. After 64 cycles, a signal of the gate 184 resets the flipflop 183 to the "0" position, whereby the output signal of the gate 184 acts as a termination signal. The speed can be increased by performing the read and rewrite operations in an overlapping manner, but this is not described for the sake of simplicity.

Figure 8:
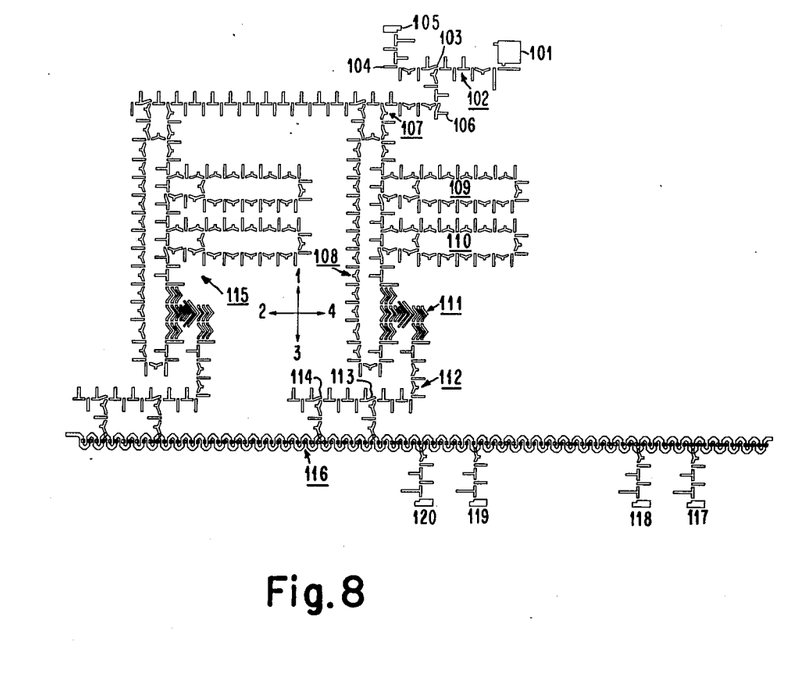
FIG. 8 shows the complete layout of a device in accordance with the invention.

FIG. 8 shows a complete layout of a device in accordance with the invention, comprising a domain generator 101, a path 102, a diverging switch 103, a path 104, domain annihilator 105, a path 106, a transfer device 107, a loop structure 108, auxiliary loop structures 109, 110, a replicator 111, a path 112, diverging switches 113, 114, a second path structure 115, an output path 116, and four domain destruction structures 117, 118, 119, 120.

In each clockwise period of the rotary magnetic field, the source 101 produces a split-off domain (see FIG. 5) which is applied, via the path 102, the diverging switch 103 and the path 104, to the annihilator 105. When the rotary magnetic field has the orientation in accordance with the arrow 1 (system of co-ordinates) and the direction of rotation becomes counter-clockwise for at least 7/4 and at the most 10/4 periods and subsequently clockwise again for 11/4 through 14/4 periods, respectively (one additional period more each time), a domain is output to the transfer device 107 via the path 106. When, in the case of field orientation 1, a domain reaches the downstream connection of the transfer device 107 with the path 106 and the direction of rotation of the rotary field is reversed, for example, for 6/4 periods, a domain is applied, via the transfer device 107, to the circular path 108 in order to pass through this path with the same direction of rotation as that of the rotary magnetic field. The auxiliary loop structures 109, 110 have transfer structures which correspond to those of the device 107 and which can be activated by a field orientation in the direction "2" (see system of co-ordinates). These transfer structures can be activated in the reverse direction, starting from a field orientation in the direction "4," so that domains which are present in corresponding positions in the auxiliary loops 109, 110 can be returned together to the loop structure 108. Assuming a field orientation in the direction "3" they can similarly be returned to the path 106, possibly at the end thereof, or they can be annihilated in one of the elements 105, 101. When a domain passes the replicator 111 during a clockwise circulation along the loop structure 108, it is first expanded along the chevron structure shown and is split during a subsequent period of the rotary magnetic field, one of the two domains then being discharged, via 112, to the diverging switches 113, 114. These switches can be activated in the field orientation "1," after which the "meander" conductor 116 is reached in 6 field periods. This conductor is again made of a conductive material and comprises separate elements per half period which are made of permalloy and which are situated halfway below/above a path of the relevant half period. The displacement direction along the "meander" conductor 116 is in this case the direction of the rotary field orientation 4. The distances between the diverging switches 113, 114 equals that between the auxiliary loops structures 109, 110, that is 2 periods, so that from each of these auxiliary loop structures a domain can be simultaneously transferred to the "meander" conductor 116. The second path structure 115 corresponds to that of the structures 107–114 and is shifted over 12 periods of the path 106 or sixteen periods of the path 116. The latter is also applicable to the domain annihilator 117/118 relative to 119/120. Thus, four information bits can be read from the auxiliary loop structures 109 . . . and be simultaneously applied to the domain annihilators 117–120. On the other hand, the path 116 can also be connected to a domain detection device, possibly comprising a plurality of domain detectors in parallel arrangement. Each auxiliary loop structure offers room for thirteen domains, so the overall capacity is 52 domains or as many bits.

The mean access time is calculated as follows:

(a) the time required for presenting the relevant domain to the output diverging switch of the auxiliary loop structure: $13:2=6\frac{1}{2}$ periods;

(b) the transfer time in the loop structure 108: 6/4 periods;

(c) the mean time required for reaching the requested diverging switch (113-114) via the loop structure 108: $14\frac{1}{4}$ periods;

(d) the take-over time required for the meander conductor path 116: 6/4 periods;

(e) the propagation time via the meander path: at least $16+4$ periods of the current excitation;

(f) the transfer time to the domain annihilators $3\frac{1}{2}$ periods of the rotary field.

Finally, the path 116 itself may include a detection element, so that the detection takes place at the same bit frequency as the driving of the "meander" conductor.

What is claimed is:

1. A magnetic bubble domain memory system comprising:
    a plate of magnetic material capable of supporting magnetic bubble domains, including a first path for storing and propagating magnetic bubble domains, comprising a plurality of spaced apart magnetically operative discrete elements, and a second path for storing and transporting magnetic bubble domains comprising at least one current conductor having a spatially periodic disposition, and having terminals connected thereto;
    interconnection means disposed between said first and second path for replicating magnetic bubble domains from a predetermined point on said first path to a predetermined point on said second path;
    means coupled to said plate for generating magnetic bubble domains;
    control means on said plate including first and second control outputs and having a first state for controlling the movement of magnetic bubble domains on said first and second paths at an identical frequency and a second state for independently controlling the movement of magnetic bubble domains on said second path at a higher frequency than on said first path;
    drive means for driving said magnetic bubble domains along said paths, comprising first drive means connected to said first control output, including a magnetic field generator for generating a rotary magnetic field which rotates in the plane of said plate with a predetermined first frequency for driving said magnetic bubble domains along said first path, and second drive means connected to said second control output including a current generator and having current outputs for generating a periodically varying electric current with a predetermined second frequency higher than said first frequency for independently driving said magnetic bubble domains along said second path, said terminals on said second path being connected to said current outputs; and
    detection means coupled to said plate for detecting the presence of magnetic bubble domains in a specific region of said plate.

2. A system as defined in claim 1, wherein said first path comprises an output, and said second path comprises an input, the output of said first path being connected to said input of said second path for transferring magnetic bubble domains from said first path to said second path.

3. A system as defined in claim 1, further comprising domain replication means coupled to said first path including an input from said first path, a first output to said first path, a domain replication section connected between said first path and said second path, and wherein said detection means is connected to said second path.

4. A system as defined in claim 1, wherein said interconnection means comprises domain replication means coupled to said first path.

5. A system as defined in claim 1, wherein said first path comprises a plurality of parallel outputs, and said second path comprises a plurality of parallel inputs connected to said respective parallel outputs of said first path.

6. A system as defined in claim 1, wherein said means coupled to said body for generating magnetic bubble domains is a domain generator and is connected to said second path for generating magnetic bubble domains thereon.

7. A system as defined in claim 1, wherein said first path comprises a first plurality of first loops, each one of said loops having a domain replicator having a first output connected to an input of said second path, and a second output connected end-around to close said one loop.

8. A system as defined in claim 1, wherein each of said first loops comprises a plurality of auxiliary loops, each auxiliary loops having an output connected to a corresponding input of the corresponding one of said first loops.

9. A magnetic bubble domain memory comprising:
    a plate of magnetic material capable of supporting magnetic bubble domains, including a first path for storing and transporting magnetic bubble domains, said first path having a plurality of spaced apart magnetically operative discrete elements, and a second path for storing and transporting magnetic bubble domains having at least one current conductor having a spatially periodic structure, and having terminals connected thereto;
    interconnection means disposed between said first path and said second path for replicating the information content of a magnetic bubble on said first path onto a single magnetic bubble on said second path;
    control means comprising first and second control outputs for independently controlling the movement of magnetic bubble domains on said first and said second paths;
    drive means for driving said magnetic bubble domains along said paths comprising:
    first dirve means connected to said first control output, including a magnetic field generator for generating a rotary magnetic field at a first frequency in the plane of said plate for driving said magnetic bubble domains along said first path; and
    second drive means connected to said second control output including a current generator and having current outputs for generating a periodically varying current selectively at a second frequency and a third frequency, wherein said second frequency is equal to said first frequency and said third frequency is at least two times higher than said second frequency, whereby said second frequency controls said replicating and said third frequency controls a rapid data transfer, said terminal on said second path being connected to said current outputs; and detection means coupled to said plate for detecting the presence of magnetic bubble domains in a specific region of said plate.

10. A system as defined in claim 9, wherein:

said interconnection means are adapted for removing a magnetic bubble from said first path and inserting it into said second path;

said detection means are coupled to said second path; and said generating means for generating magnetic bubble domains are coupled to said first path.

11. A system as defined in claim 9, wherein:

said interconnection means are adapted for removing a magnetic bubble from said first path and inserting it into said second path;

said detection means are coupled to said second path;

second interconnection means disposed between said first path and said second path for removing a magnetic bubble from said second path and reinserting it into said first path under control of said second frequency.

12. A magnetic bubble domain memory comprising:

a plate of magnetic material capable of supporting magnetic bubble domains, comprising;

first path for storing and supporting magnetic bubble domains, having a plurality of spaced apart magnetically operative discrete elements;

a second path for storing and transporting magnetic bubble domains comprising:

at least one current conductor having a spatially periodic structure and having terminals connected thereto;

a plurality of interconnection means disposed between said first path and said second path for replicating in parallel the information content of a magnetic bubble on said first path onto a single magnetic bubble on said second path for realizing a parallel to serial conversion;

control means comprising first and second control outputs for independently controlling the movement of magnetic bubble domains on said first and said second paths;

drive means for driving said magnetic bubble domains along said paths, comprising:

first drive means connected to said first control output;

a magnetic field generator for generating a rotary magnetic field at a first frequency in the plate for driving said magnetic bubble domains along said first path; and second drive means connected to said second control output;

a current generator and having current outputs for generating a periodically varying current at a second frequency which is at least two times higher than said first frequency;

whereby said first frequency controls said replicating and said second frequency controls a rapid data transfer;

said terminals on said second path being connected to said current outputs; and detection means coupled to said plate for detecting the presence of magnetic bubble domains in a specific region of said plate.

13. A system as defined in claim 12, wherein:

a second plurality of interconnection means are disposed between said first path and said second path for removing in parallel a magnetic bubble from said second path and inserting it into said first path for realizing a serial to parallel conversion; and whereby said detection means comprise a plurality of detection members each connected to an output of one of said second plurality of interconnection means.

14. A system as defined in claim 13, wherein said second plurality is equal to said first plurality.

* * * * *